United States Patent
Itasaka

Patent Number: 5,833,288
Date of Patent: Nov. 10, 1998

[54] VACUUM SUCTION FORCEPS

[75] Inventor: Hideki Itasaka, Yamagata, Japan

[73] Assignee: NEC Corporation, Tokyo, Japan

[21] Appl. No.: 895,170

[22] Filed: Jul. 16, 1997

[30] Foreign Application Priority Data

Jul. 16, 1996 [JP] Japan .................................. 8-185842

[51] Int. Cl.$^6$ .................................................. B25J 15/06
[52] U.S. Cl. ........................................ 294/64.1; 414/941
[58] Field of Search .............................. 294/2, 64.1–64.3, 294/65; 414/941; 901/40; 29/743, 758; 269/21

[56] References Cited

U.S. PATENT DOCUMENTS

| | | | |
|---|---|---|---|
| 1,757,529 | 5/1930 | Jones | 294/64.1 |
| 4,685,714 | 8/1987 | Hoke | 294/65 |
| 4,767,142 | 8/1988 | Takahashi et al. | 294/64.1 |
| 5,050,919 | 9/1991 | Yakou | 294/64.1 |

FOREIGN PATENT DOCUMENTS

| | | | |
|---|---|---|---|
| 62-130536 | 6/1987 | Japan | 294/64.1 |
| 2-222557 | 9/1990 | Japan . | |
| 4-88046 | 7/1992 | Japan . | |
| 6-53306 | 2/1994 | Japan | 414/941 |
| 6-27087 | 4/1994 | Japan . | |

Primary Examiner—Dean Kramer

[57] ABSTRACT

A vacuum suction forceps includes a plurality of vacuum sucking portions, a plurality of arms, an arm opening/closing mechanism, and a main body. The sucking portions draw a suction target by vacuum suction. The arms support the vacuum sucking portions at distal ends thereof and have evacuating hollow portions. The arm opening/closing mechanism openably supports the arms to cause the vacuum sucking portions to be close to and separate from each other on the same plane. The main body is connected to the arm opening/closing mechanism and an evacuation tube. The main body turns on/off an evacuating operation of the vacuum sucking portions.

5 Claims, 4 Drawing Sheets

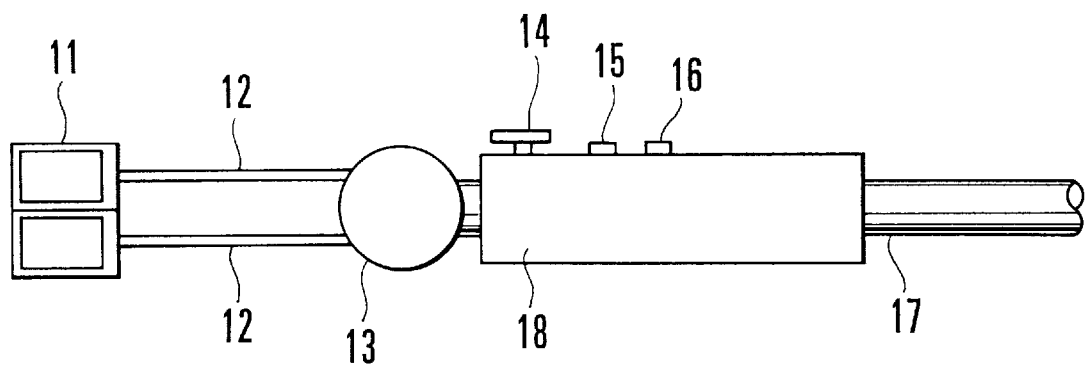
F I G. 1

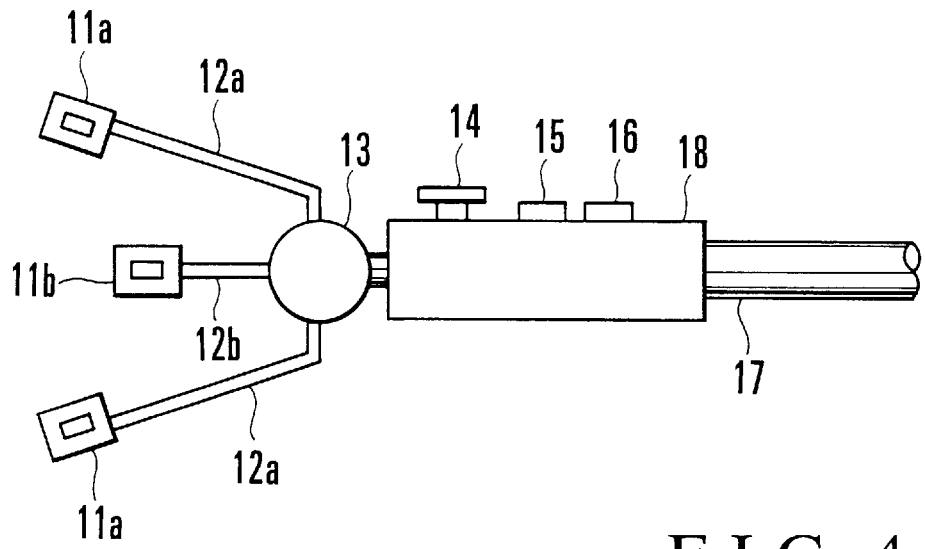
F I G. 4

VACUUM SUCTION FORCEPS

BACKGROUND OF THE INVENTION

The present invention relates to a vacuum suction forceps for drawing a suction target by vacuum suction and transferring it and, more particularly, to a vacuum suction forceps for transferring semiconductor wafers.

As the diameter of a semiconductor wafer increases, the mass of the wafer increases accordingly, and a vacuum suction forceps that holds this wafer must be devised. A vacuum suction forceps of this type has a plurality of vacuum sucking portions. Arms that support these vacuum sucking portions are made flexible. The vacuum sucking portions are therefore arranged in accordance with the shape of the wafer serving as a suction target, and draw and transfer the wafer.

FIG. 5 shows a vacuum suction forceps proposed in Japanese Utility Model Laid-Open No. 6-27087 to convey conventional semiconductor wafers and the like. This vacuum suction forceps has a pair of vacuum sucking portions (heads) 1 for drawing a semiconductor wafer by suction, flexible arms 2 for supporting the vacuum sucking portions 1, a branch portion 9 for branching the arms 2, and a main body portion 8 connected to the branch portion 9 to turn on/off vacuum suction. The vacuum sucking portions 1 are fixedly arranged in accordance with the shape of the semiconductor wafer. The main body portion 8 is connected to an evacuation tube 7 connected to a vacuum pump to turn on/off vacuum suction by means of a vacuum cancel button 4.

Japanese Patent Laid-Open No. 2-222557 also shows a vacuum pincette having a plurality of vacuum sucking sections fixedly arranged in the same manner. Japanese Utility Model Laid-Open No. 4-88046 proposes a vacuum forceps in which an arm that supports a vacuum sucking portion is axially rotated by a motor in order to prevent an evacuating tube from being twisted.

In the conventional vacuum suction forceps described above, in transfer of wafers loaded in a magazine, when the vacuum sucking portions 1 are to be inserted between the wafers in order to draw one wafer by suction, the wafer might be damaged. More specifically, in order to stably draw the wafer by suction, the vacuum sucking portions 1 must be opened to match the wafer diameter, and be inserted between the wafers. The influence of an angular shift between the vacuum sucking portions 1 about the longitudinal direction of the vacuum suction forceps as the rotation axis increases in proportion to the gap formed between the wafers. Hence, when inserting the vacuum sucking portions 1 between the wafers, the margin of the vacuum sucking portions 1 between the wafers decreases, thus damaging the wafers.

SUMMARY OF THE INVENTION

It is an object of the present invention to provide a vacuum suction forceps capable of stably transferring even a large-diameter wafer.

In order to achieve the above object, according to an aspect of the present invention, there is provided a vacuum suction forceps comprising a plurality of first vacuum sucking portions for drawing a suction target by vacuum suction, a plurality of first arms supporting the first vacuum sucking portions at distal ends thereof and having evacuating hollow portions, an arm support portion for openably supporting the first arms to cause the first vacuum sucking portions to be close to and separate from each other on the same plane, and a main body connected to the arm support portion and an evacuation tube, the main body turning on/off an evacuating operation of the first vacuum sucking portions.

BRIEF DESCRIPTION OF THE DRAWINGS

FIG. 1 is a plan view of a vacuum suction forceps according to the first embodiment of the present invention;

FIG. 4 is a plan view of a vacuum suction forceps according to the second embodiment of the present invention.

DESCRIPTION OF THE PREFERRED EMBODIMENTS

Figure 2A:
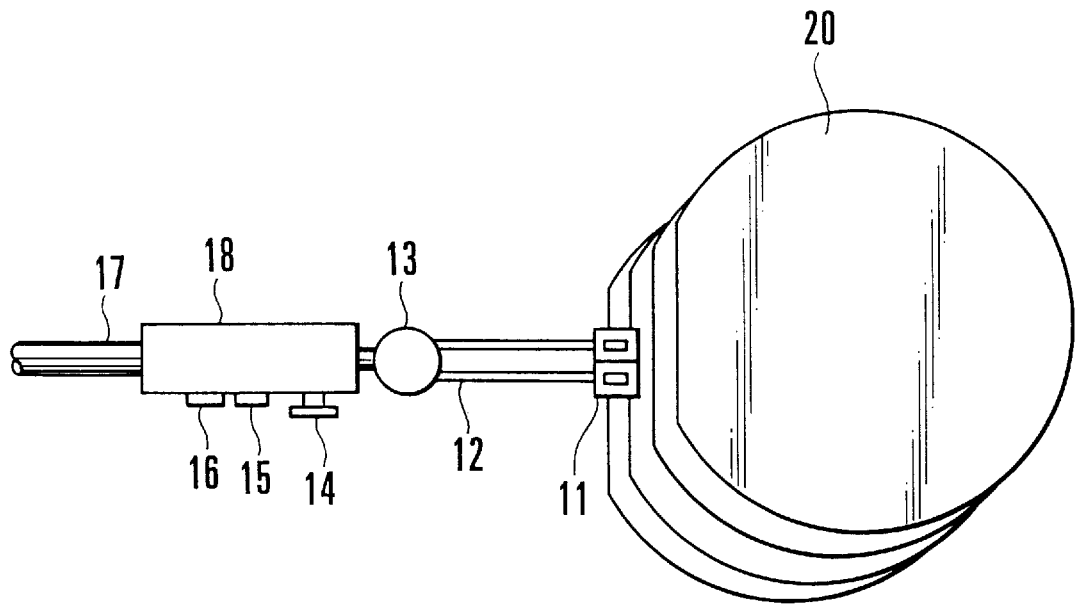
FIGS. 2A and 2B are views for explaining an operation of inserting the vacuum suction forceps shown in FIG. 1 between wafers.

The present invention will be described in detail with reference to the accompanying drawings.

FIG. 1 shows a vacuum suction forceps according to the first embodiment of the present invention. Referring to FIG. 1, the vacuum suction forceps has two vacuum sucking portions 11. The suction surfaces of the respective vacuum sucking portions 1 are arranged on the same plane. The vacuum sucking portions 11 are supported on the distal ends of cylindrical arms 12 having hollow portions, and the arms 12 are supported by an arm opening/closing mechanism 13 at their proximal end portions so that they are driven by the mechanism 13 to open/close. The arm opening/closing mechanism 13 is connected to a main body 18. The main body 18 has a vacuum cancel button 14, an opening button 15, and a closing button 16.

Upon operation of the arm opening button 15, the arm opening/closing mechanism 13 drives, for example electrically, the arms 12 to enlarge the gap between the vacuum sucking portions 11. Upon operation of the arm closing button 16, the arm opening/closing mechanism 13 drives the arms 12 to decrease the gap between the vacuum sucking portions 11. When the arms 12 are closed, they are parallel to each other and the vacuum sucking portions 11 are close to each other. When the arms 12 are opened, the vacuum sucking portions 11 separate from each other in accordance with the angle between the arms 12. The main body 18 is connected to a vacuum pump (not shown) through an evacuation tube 17. The openings of the vacuum sucking portions 11 communicate with the evacuation tube 17 through the hollow portions of the arms 12, the arm opening/closing mechanism 13, and the main body 18.

Figure 2B:
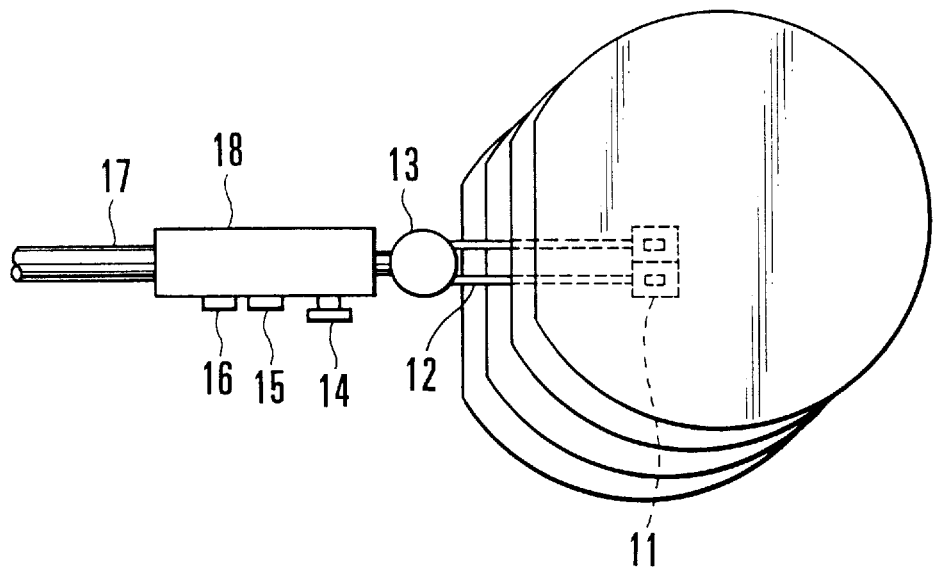

The operation of the vacuum suction forceps having the above arrangement will be described with reference to FIGS. 2A and 2B, and FIGS. 3A and 3B. As shown in FIG. 2A, the vacuum sucking portions 11 whose arms 12 are closed are moved near semiconductor wafers 20 that are stacked at predetermined gaps from each other. While the arms 12 are kept closed, the main body 18 is further moved toward the semiconductor wafers 20, and the vacuum sucking portions 11 are inserted between the semiconductor wafers 20, as shown in FIG. 2B. Since the arms 12 are closed, they will not be easily influenced by an angular shift between the vacuum sucking portions 11 about the longitudinal direction of the main body 18 as the rotation axis.

Figure 3A:
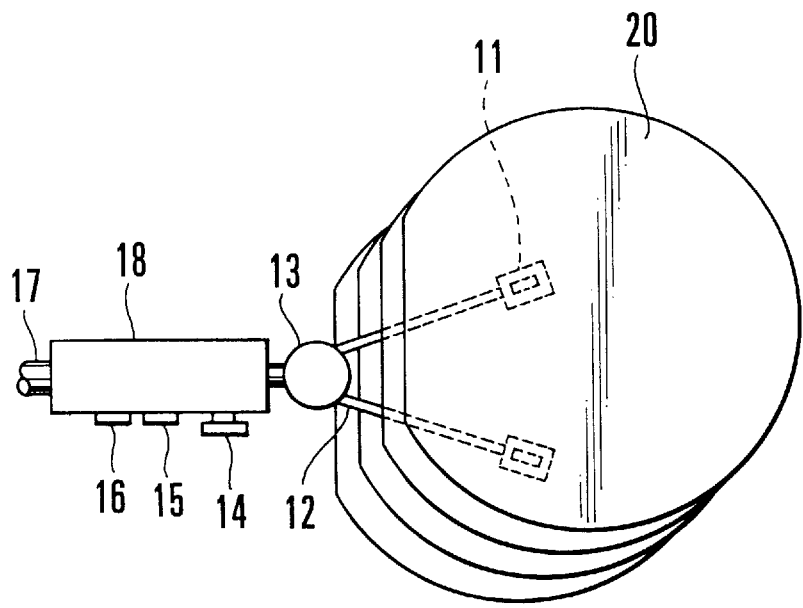
FIGS. 3A and 3B are views for explaining a wafer transfer operation of the vacuum suction forceps shown in FIG. 1.
Figure 3B:
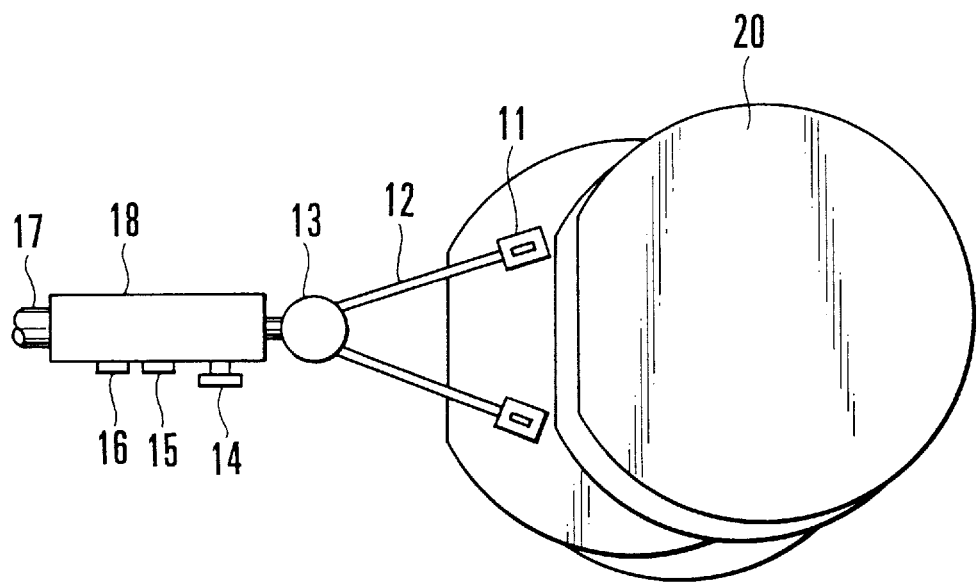
Figure 5:
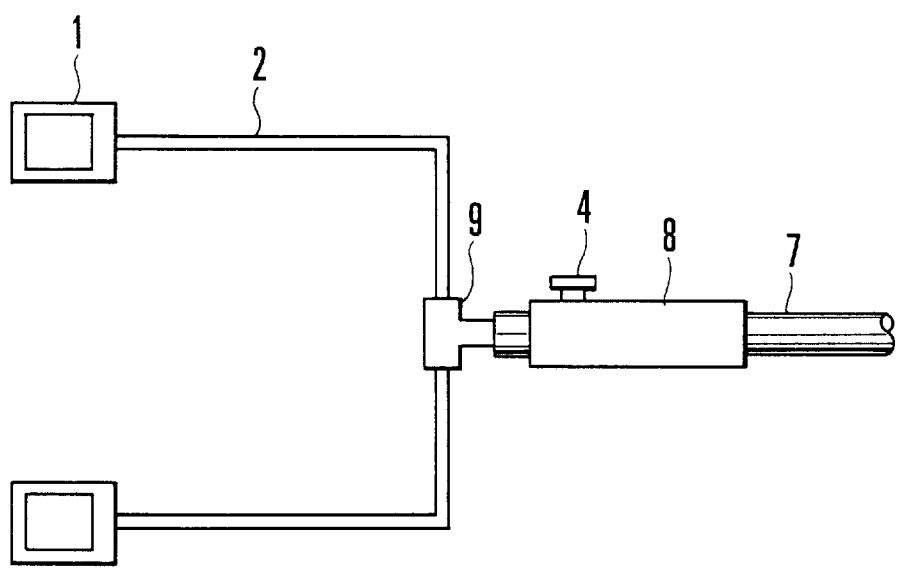
FIG. 5 is a plan view of a conventional vacuum suction forceps.

As shown in FIG. 3A, the opening button 15 is operated to activate the arm opening/closing mechanism 13, thereby opening the arms 12 to match the diameter of the semiconductor wafers 20. Thereafter, a wafer 20 is drawn by the vacuum sucking portions 11 that are separate from each other. As shown in FIG. 3B, while the semiconductor wafer 20 is kept drawn, the main body 18 is pulled backward, thereby transferring the semiconductor wafer 20 by suction. After the semiconductor wafer 20 is transferred, the vacuum cancel button 14 is operated to cancel the operation of drawing the semiconductor wafers 20 by suction. Even a large-diameter wafer can be transferred stably with this arrangement.

FIG. 4 shows a vacuum suction forceps according to the second embodiment of the present invention. Referring to FIG. 4, two outer vacuum sucking portions 11a on the right and left sides and a central vacuum sucking portion 11b are mounted on the vacuum suction forceps. Arms 12a respectively supporting the vacuum sucking portions 11a can be driven by an arm opening/closing mechanism 13 to open/close, and an arm 12b supporting the vacuum sucking portion 11b is fixed on the arm opening/closing mechanism 13. With this arrangement, even a large-diameter wafer can be drawn by suction and transferred further stably.

As has been described above, according to the present invention, after the sucking portions that are closed are inserted between wafers, the gap between the sucking portions is increased, and a wafer is drawn by suction, so that the influence of an angular shift during insertion about the longitudinal direction of the vacuum suction forceps as the rotation axis can be minimized. As a result, transfer of large-diameter wafers from a magazine, which needs a large suction force, can be performed stably without damaging the wafers.

What is claimed is:

1. A vacuum suction forceps for entry between suction targets stacked at a predetermined distance from each other, comprising:

a plurality of first vacuum sucking portions in a common plane for drawing a suction target by vacuum suction;

a plurality of first arms supporting said first vacuum sucking portions and having evacuating hollow portions;

an arm support portion for supporting said first arms to move substantially in said plane and cause said first vacuum sucking portions to alternatively be close together and separate from each other in said plane; and a main body connected to said arm support portion and to an evacuation tube, said main body turning on/off an evacuating operation of said first vacuum sucking portions.

2. A forceps according to claim 1, wherein said arm support portion electrically controls an opening/closing operation of said first arms.

3. A forceps according to claim 2, wherein said main body has a suction cancel button for canceling a drawing operation of said vacuum sucking portions, an opening button for designating an opening operation of said arms effected by said arm support portion, and a closing button for designating a closing operation of said arms effected by said arm support portion.

4. A forceps according to claim 1, wherein said first vacuum sucking portions and said first arms are provided to form two sets, and said first arms pivot relative to each other about said arm support portion as a center in accordance with a size of the suction target.

5. A forceps according to claim 1, further comprising at least one second arm arranged between said first vacuum sucking portions and fixedly supported by said arm support portion, and a second vacuum sucking portion supported at a distal end of said second arm and having an evacuating hollow portion.

* * * * *